(12) United States Patent
Yoon et al.

(10) Patent No.: US 8,614,507 B2
(45) Date of Patent: Dec. 24, 2013

(54) SEMICONDUCTOR DEVICES HAVING LOWER AND UPPER INTERCONNECTION STRUCTURES THAT EXHIBIT REDUCED COUPLING

(75) Inventors: Joong-ho Yoon, Gwangmyeong-si (KR); Tackyung Kim, Seoul (KR); Kang-Sup Roh, Seoul (KR); Jun-Seok Kim, Yongin-si (KR); Eun-Jung Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 471 days.

(21) Appl. No.: 12/889,499

(22) Filed: Sep. 24, 2010

(65) Prior Publication Data

US 2011/0121455 A1 May 26, 2011

(30) Foreign Application Priority Data

Nov. 20, 2009 (KR) .................... 10-2009-0112662

(51) Int. Cl.
   *H01L 23/48* (2006.01)
(52) U.S. Cl.
   USPC ................ 257/758; 257/759; 257/760
(58) Field of Classification Search
   USPC ................................ 257/758–760
   See application file for complete search history.

(56) References Cited

U.S. PATENT DOCUMENTS

| 5,841,688 | A | * | 11/1998 | Sukegawa et al. | 365/63 |
| 6,890,828 | B2 | * | 5/2005 | Horak et al. | 438/319 |
| 6,919,639 | B2 | | 7/2005 | Ho et al. | |
| 7,075,182 | B2 | * | 7/2006 | Mitani et al. | 257/758 |
| 7,115,985 | B2 | * | 10/2006 | Antol et al. | 257/700 |
| 7,935,621 | B2 | * | 5/2011 | Basker et al. | 438/598 |
| 8,183,698 | B2 | * | 5/2012 | Antol et al. | 257/780 |
| 2002/0024144 | A1 | * | 2/2002 | Keeth | 257/758 |
| 2006/0038296 | A1 | * | 2/2006 | King et al. | 257/758 |
| 2007/0120258 | A1 | * | 5/2007 | Hayashi et al. | 257/758 |
| 2009/0004843 | A1 | | 1/2009 | Mokhlesi et al. | |
| 2009/0014882 | A1 | * | 1/2009 | Ito et al. | 257/758 |

FOREIGN PATENT DOCUMENTS

| KR | 1020040057819 A | 7/2004 |
| KR | 1020080030849 A | 4/2008 |
| KR | 1020080061932 A | 7/2008 |

* cited by examiner

*Primary Examiner* — James Mitchell
(74) *Attorney, Agent, or Firm* — Myers Bigel Sibley & Sajovec

(57) ABSTRACT

An interconnection structure for a semiconductor device may include lower interconnection patterns disposed in a checker board shape and upper interconnection patterns disposed in a checker board shape and connecting two adjacent lower interconnection patterns to each other.

20 Claims, 21 Drawing Sheets

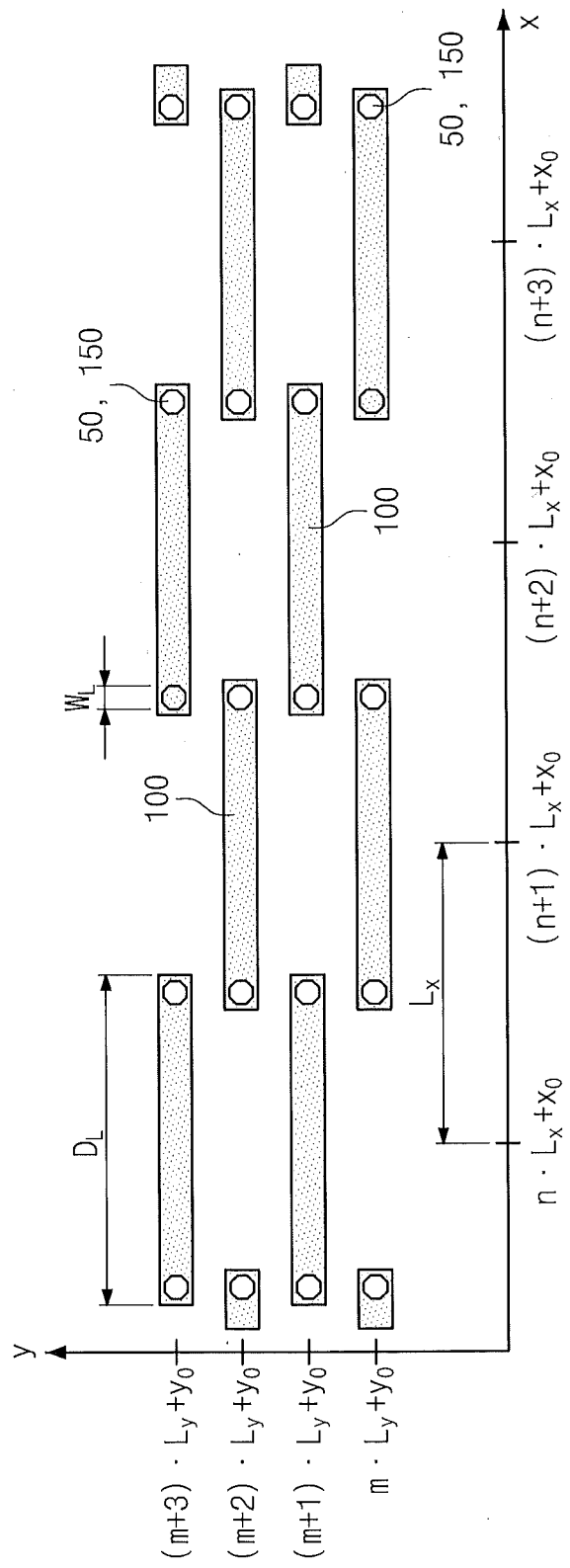

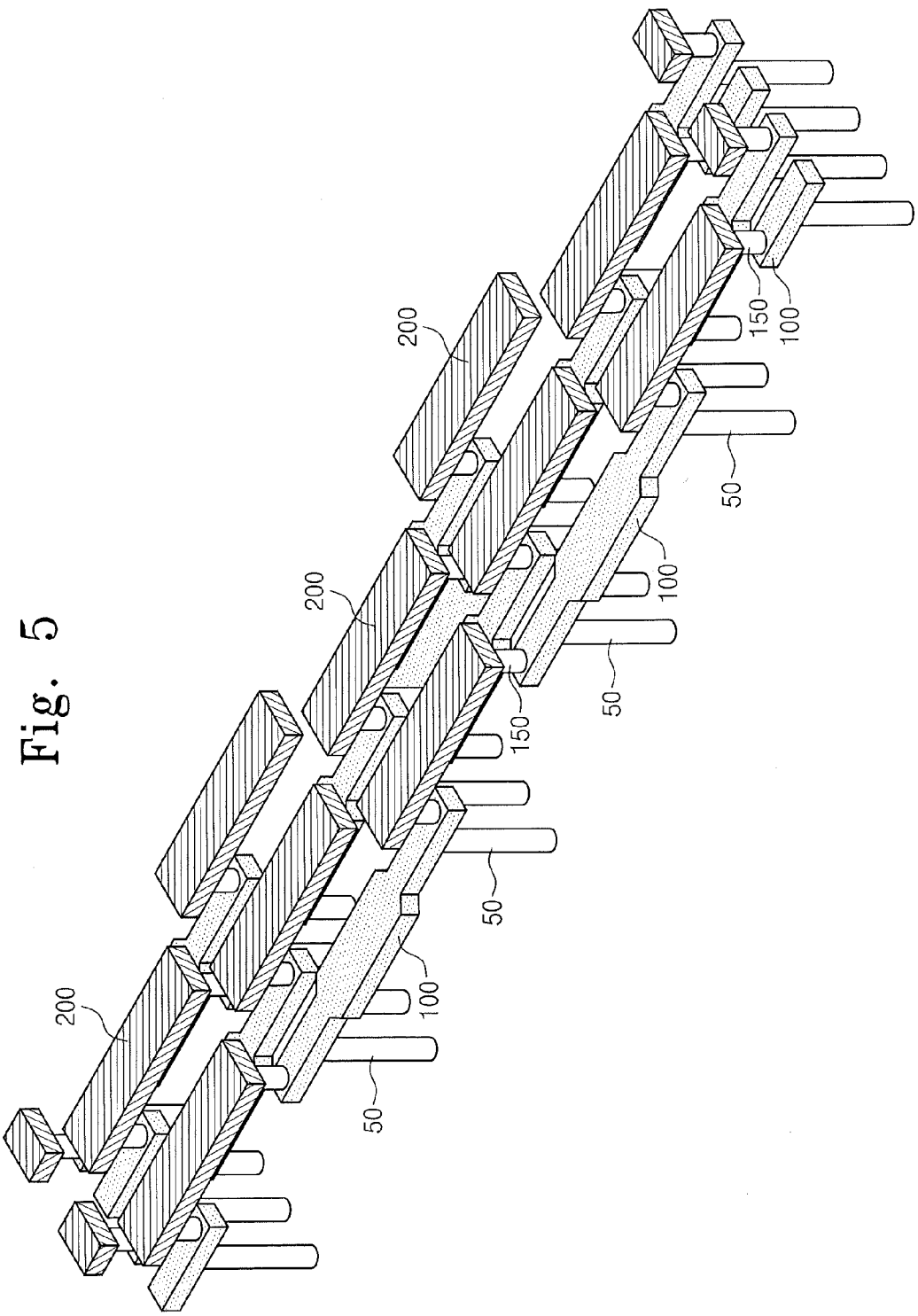

[Line patterns]

[Isolated patterns]

[Line & Isolated patterns]

SEMICONDUCTOR DEVICES HAVING LOWER AND UPPER INTERCONNECTION STRUCTURES THAT EXHIBIT REDUCED COUPLING

CROSS-REFERENCE TO RELATED APPLICATION

This U.S. non-provisional patent application claims priority under 35 U.S.C. §119 of Korean Patent Application 10-2009-0112662, filed on Nov. 20, 2009, the entire contents of which are hereby incorporated by reference.

BACKGROUND

The present inventive concept relates to semiconductor devices and, more particularly, to interconnection structures for semiconductor devices.

Semiconductor devices having increased integration density are needed in order to satisfy consumer demand for high perfoimance low cost devices. In the case of general two-dimensional or planar semiconductor memory devices, the level of integration may be primarily determined by the area required for each unit cell of the device. In such devices, the integration density is primarily increased by decreasing the width of the pattern used to form such unit cells.

However, when the width of the pattern is decreased, various technical difficulties may arise. For example, when the width of the pattern is decreased to 50 nm or less, new lithography arts such as immersion lithography, EUV lithography, or double patterning art may be required to form the pattern.

In addition, in order to rapidly transmit electric signals through the semiconductor device, the resistance of the interconnection needs to be kept low. Since the resistance of the interconnection is inversely proportional to the cross-sectional area of the interconnection, when the width of the interconnection is decreased, the thickness of the interconnection may need to be increased in order to maintain a low resistance value. However, when the interconnections are disposed at narrow intervals as is often the case, for example, with bit lines of semiconductor memory devices, an increase in thickness of the interconnection may cause an increase in capacitance or coupling between the interconnections. This capacitance/coupling may generate secondary technical problems such as RC-delay and crosstalk between interconnections that may degrade the performance of the semiconductor device.

SUMMARY

The present inventive concept provides interconnection structures that may reduce coupling between interconnections.

The present inventive concept also provides NAND flash memory devices that may have reduced coupling between bit lines without increasing costs.

Embodiments of the inventive concept provide a semiconductor device including: nodes that are two-dimensionally arranged on a substrate; lower interconnection patterns that are connected to the nodes; and upper interconnection patterns that are connected to the lower interconnection patterns. The upper interconnection patterns are arranged at positions where an absolute value of (n−m) is an even number among coordinate sets given by $(n*L_x, m*L_y)$, and the lower interconnection patterns are arranged at positions where the absolute value of (n−m) is an odd number among the coordinate sets given by $(n*L_x, m*L_y)$ (where n and m are natural numbers, and $L_x$ and $L_y$ are unit lengths in x and y directions).

In some embodiments, the semiconductor device may further include: lower plugs that are disposed between the lower interconnection patterns and the nodes; and upper plugs that are disposed between the lower and upper interconnection patterns. In such embodiments, the lower interconnection patterns may be connected to a pair of adjacent nodes having substantially the same y coordinate, and each of the upper interconnection patterns may be connected to a pair of adjacent lower interconnection patterns having substantially the same y coordinate.

In other embodiments, the nodes having the same y coordinate may be electrically connected to each other through the lower and upper interconnection patterns having substantially the same y coordinate. In addition, the lower interconnection patterns connected to the nodes having different y coordinates may be electrically isolated from each other, and the upper interconnection patterns connected to the lower interconnection patterns having different y coordinates may be electrically isolated from each other.

In still other embodiments, the upper interconnection patterns may be formed from a material having specific resistance lower than a specific resistance of the material used to form the lower interconnection patterns. In some embodiments, the substrate may include a cell array region and a peripheral circuit region, and peripheral elements constituting a peripheral circuit and metallic interconnections electrically connecting the peripheral elements to each other may further be formed on the substrate of the peripheral circuit region. In this case, the upper interconnection patterns and the metallic interconnections may be formed using the same process to be substantially formed from the same material. In addition, the metallic interconnection and the upper interconnection pattern may contain at least one of aluminum and copper, and the lower interconnection pattern may contain tungsten.

In still further embodiments, each of the lower and upper interconnection patterns may be a line-shaped conductive pattern connected to a pair of adjacent nodes.

In yet other embodiments, the semiconductor device may further include upper plugs that are disposed between the lower and upper interconnection patterns, and each of the lower and upper interconnection patterns may include connection portions connected to a pair of adjacent upper plugs and a body portion disposed between the connection portions. In some embodiments, the body portion may have a width wider than that of the connection portions.

In further embodiments, the semiconductor device may further include: lower plugs that are disposed between the lower interconnection patterns and the nodes; and upper plugs that are disposed between the lower and upper interconnection patterns. In this case, each of the lower interconnection patterns may have a length longer than that of each of the upper interconnection patterns, and x coordinates of the upper plugs may be different from those of the lower plugs.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings:

FIGS. 2A and 2B are plan views of the lower and upper interconnection patterns of the semiconductor device of FIG. 1;

FIG. 5 is a perspective view illustrating interconnection structures of a semiconductor device according to still further embodiments of the inventive concept;

DETAILED DESCRIPTION OF THE EMBODIMENTS

Figure 1:
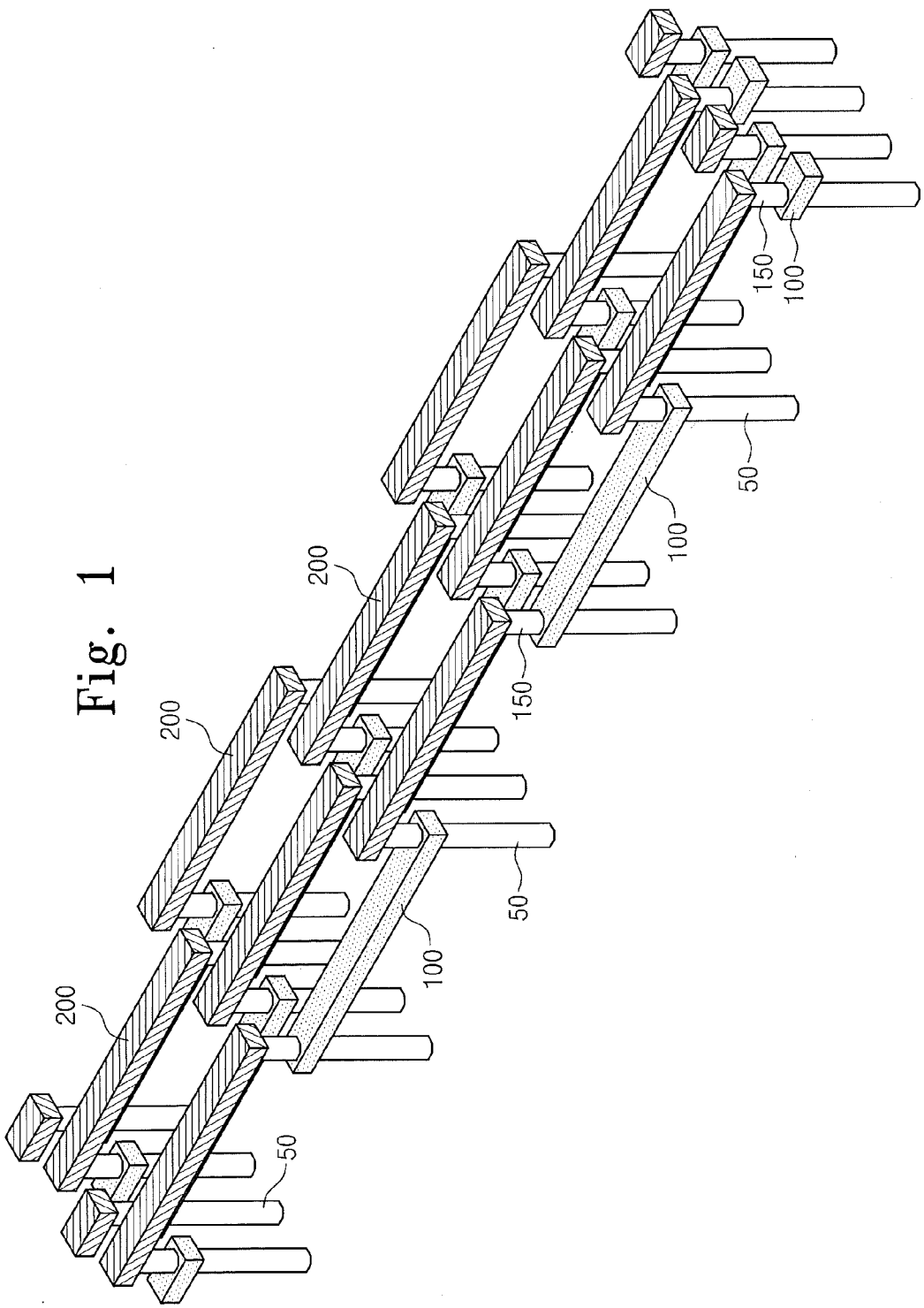
FIG. 1 is a perspective view illustrating interconnection structures of a semiconductor device according to an embodiment of the inventive concept.

Advantages and features of the present inventive concept and methods of accomplishing the same may be understood more readily by reference to the following detailed description of exemplary embodiments thereof and the accompanying drawings. The exemplary embodiments of the inventive concept may, however, be embodied in many different forms and should not be construed as being limited to the embodiments set forth herein. Rather, these embodiments are provided so that this disclosure will be thorough and complete and will fully convey the scope of the inventive concept to those skilled in the art, and the embodiments of the inventive concept will only be defined by the appended claims. Like reference numerals refer to like elements throughout the specification.

It will be understood that when any layers such as a conductive layer, a semiconductor layer, and an insulating layer are referred to as being "on" another material layer or substrate, it may be directly on the other material layer or substrate or intervening elements or layers may be present. In contrast, when an element or layer is referred to as being "directly on," "directly connected to," or "directly coupled to" another element or layer, there are no intervening elements or layers present. In drawings, the thickness of elements, layers and regions may be exaggerated to effectively describe technical details. It will be understood that, although the terms first, second, etc. are used herein to describe various elements, these elements should not be limited by these terms. These terms are used to distinguish one element from another.

Figure 2B:
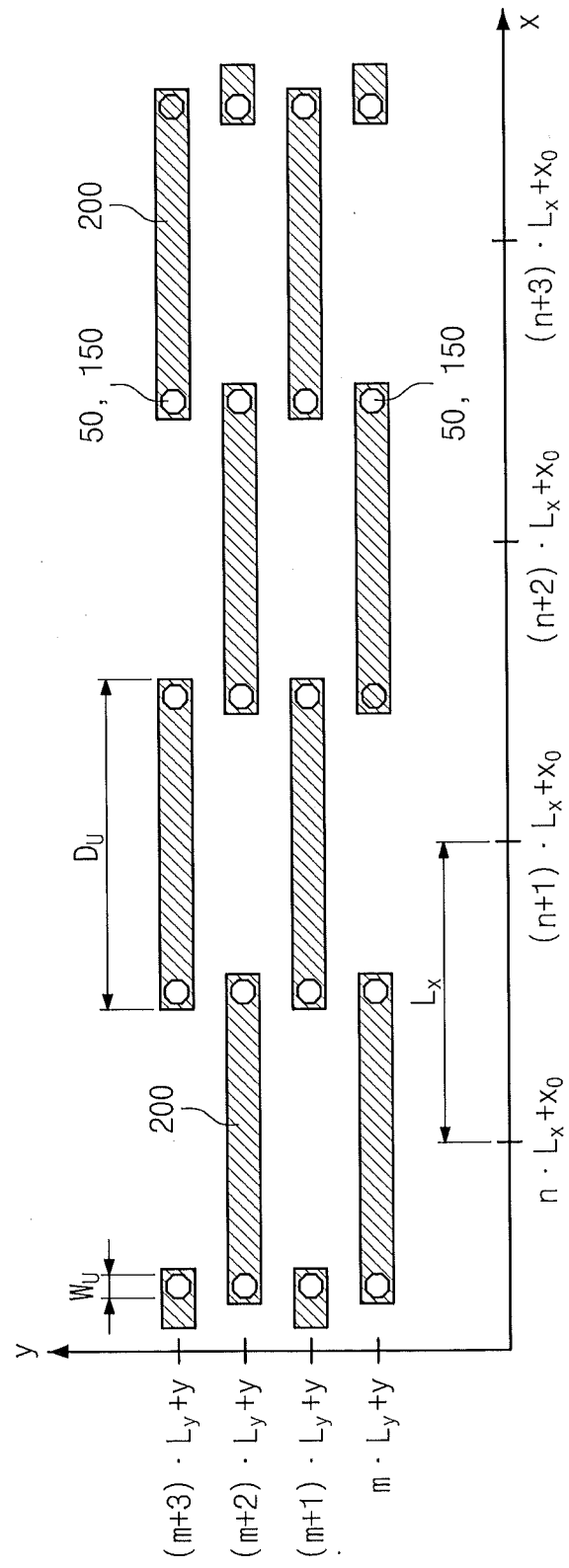

FIG. 1 is a perspective view illustrating interconnection structures of a semiconductor device according to an embodiment of the inventive concept. FIGS. 2A and 2B are plan views of the lower and upper interconnection patterns according to the embodiment of the inventive concept depicted in FIG. 1.

With reference to FIG. 1, a plurality of lower plugs 50 are two-dimensionally arranged on a substrate (not illustrated). Lower interconnection patterns 100 and upper interconnection patterns 200 are sequentially stacked on the lower plugs 50. Upper plugs 150 are arranged between the lower and upper interconnection patterns 100 and 200 so as to electrically connect them to each other.

Each of the lower interconnection patterns 100 and the upper interconnection patterns 200 may have a bar shape which has a long axis substantially parallel to a predetermined x-y plane (such as, for example, the upper surface of the substrate) as illustrated in FIGS. 2A and 2B. Thus, the lower and upper interconnection patterns 100 and 200 may have a shape in which the length of the pattern is longer than the width. In some embodiments, the ratio between the width and the length the lower and upper interconnection patterns 100 and 200 may be in the range from 32 to 128. In some embodiments, the lower and upper interconnection patterns 100 and 200 may have a shape in which both ends are rounded differently from the shape illustrated in FIG. 1.

In some embodiments, the lower interconnection pattern 100 and the lower plug 50 may be formed by the same process. In such embodiments, the lower interconnection pattern 100 and the lower plug 50 may be substantially formed from the same material. For example, the lower interconnection pattern 100 and the lower plug 50 may be formed by a dual damascene process. In other embodiments, the lower interconnection pattern 100 and the lower plug 50 may be independently formed by different processes.

The lower plug 50 may fill contact holes that penetrate an insulating material disposed therebelow. When the lower interconnection pattern 100 and the lower plug 50 are formed by the same process, the lower interconnection pattern 100 and the lower plug 50 may be formed from a material having excellent burying characteristics. For example, in some embodiments, the lower interconnection pattern 100 and the lower plug 50 may be tungsten, but the inventive concept is not limited thereto.

The upper interconnection pattern 200 may be formed from a material that is different from the material used to form the lower interconnection pattern 100. For example, the upper interconnection pattern 200 may be formed from a material (for example, aluminum or copper) that has a specific resistance that is lower than a specific resistance of the lower interconnection pattern 100.

In some embodiments, the upper interconnection pattern 200 and the upper plug 150 may be formed by the same process. In this case, the upper interconnection pattern 200 and the upper plug 150 may be substantially formed from the same material. For example, the upper interconnection pattern 200 and the upper plug 150 may be formed by a dual damascene process.

Each of the upper plugs 150 may be formed to extend substantially vertically from a respective one of the lower plugs 50. That is, the upper plugs 150 and the lower plugs 50 may be substantially formed at the same positions on the x-y axis, resulting in a vertically stacked plug structure as illustrated in FIG. 1. In more detail, with reference to FIGS. 2A and 2B, when coordinates of reference points selected from arbitrary points on the substrate are denoted by $(X_0, Y_0)$, the positions of the lower plugs 50 and the upper plugs 150 may be described by the same coordinate set given by $((n+1/2)*L_x+x_0, (m+1/2*L_y+y_0))$.

Two adjacent lower plugs 50 are electrically connected to each other by each of the lower interconnection patterns 100, and two adjacent lower interconnection patterns 100 are electrically connected to each other by each of the upper interconnection patterns 200. According to the embodiment of the inventive concept illustrated in FIG. 1, the arrangement configuration of the upper interconnection patterns 200 and the arrangement configuration of the lower interconnection patterns 100 may be a checkerboard pattern. Note that the lower interconnection patterns 100 and the upper interconnection patterns 200 may have the same lengths and widths and/or may have different lengths and/or widths in this checkerboard configuration. Also note that adjacent lower interconnection patterns 100 and upper interconnection patterns 200 in a particular connection line may overlap to some degree (i.e., in the area of the upper plugs 150).

In more detail, as illustrated in FIGS. 2A and 2B, the positions of the center points of the lower interconnection patterns 100 may be described by a first sub-coordinate set satisfying a condition that an absolute value of (n−m) is an odd number among the coordinate set given by $(n*L_x+x_0, m*L_y+y_0)$, where n and m are natural numbers that are smaller than the sum of the numbers of the lower and upper interconnection patterns 100 and 200 arranged in the x and y directions, $L_x$ and $L_y$ are unit lengths in the x and y directions, respectively, and $x_0$ and $y_0$ are reference point coordinates in the coordinate system to be used. For example, when the reference point is selected as one center point of the lower interconnection patterns 100 and the unit lengths $L_x$ and $L_y$ are set as a unit value, the sub-coordinates such as {(1, 2), (1, 4), (1, 6), ..., (2, 1), (2, 3), (2, 5), ..., (3, 2), (3, 4), (3, 6), ...} may be included in the first sub-coordinate set.

Similarly, the center points of the upper interconnection patterns 200 may be described by a second sub-coordinate set satisfying a condition that an absolute value of (n−m) is an even number among the coordinate set given by $(n*L_x+x_0, m*L_y+y_0)$. For example, the sub-coordinates such as {(1, 1), (1, 3), (1, 5), ..., (2, 0), (2, 2), (2, 4), ..., (3, 1), (3, 3), (3, 5), ...} may be included in the second sub-coordinate set.

In addition, as illustrated in FIGS. 2A and 2B, the respective lengths $D_L$ and $D_U$ of the lower and upper interconnection patterns 100 and 200 may be longer than the unit length $L_x$ in the x direction. In some embodiments, the lengths $D_L$ and $D_U$ of the lower and upper interconnection patterns 100 and 200 may be longer than the sum of the width $W_L$ of the lower plug and the unit length $L_x$ in the x direction, and may be shorter than twice the unit length $L_x$ in the x direction. In other words, in these embodiments $L_x+W_L<D_L<2L_x$ and $L_x+W_L<D_U<2L_x$.

Figure 3:
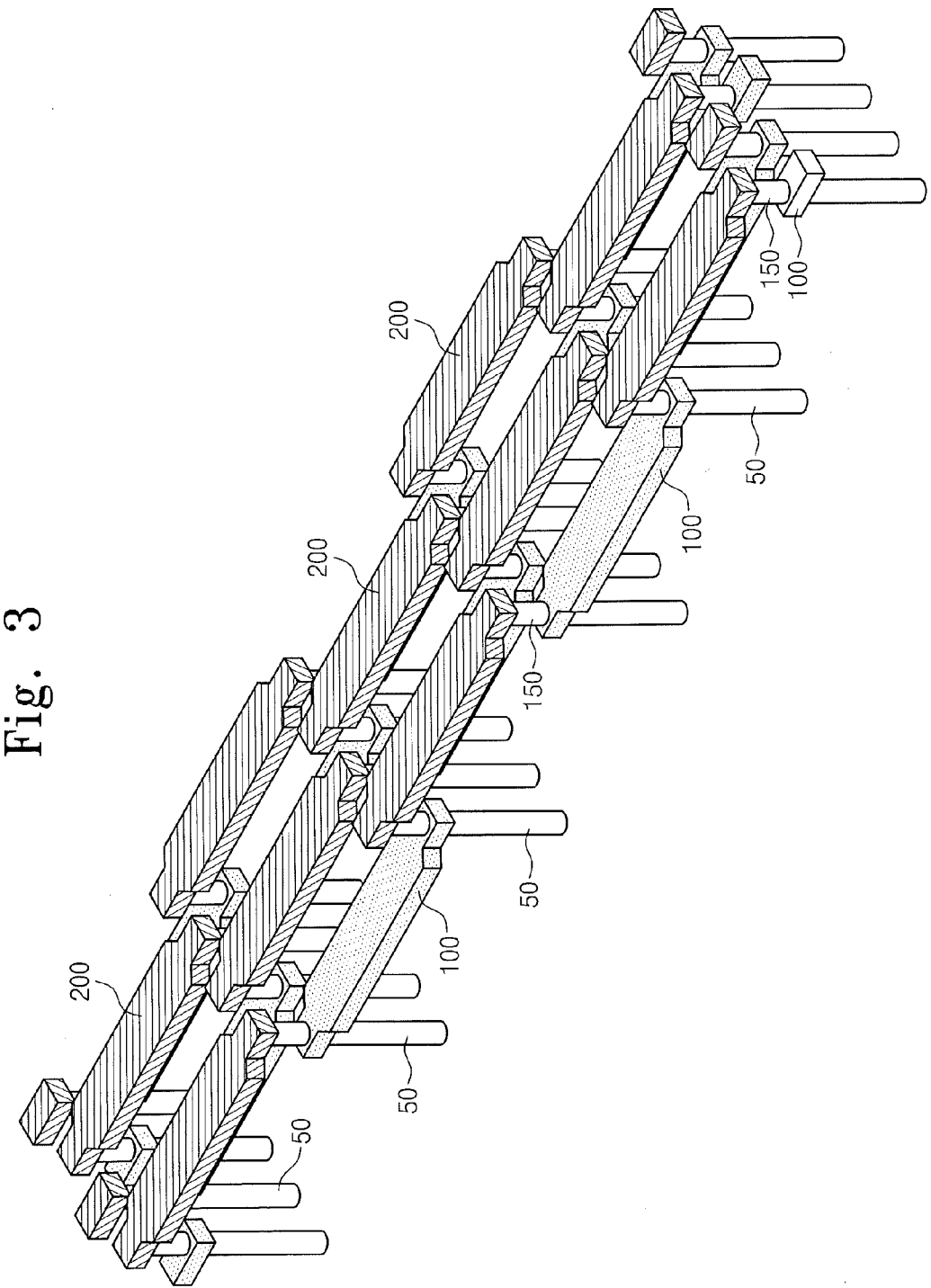
FIG. 3 is a perspective view illustrating the interconnection structures of a semiconductor device according to another embodiment of the inventive concept.
Figure 4A:
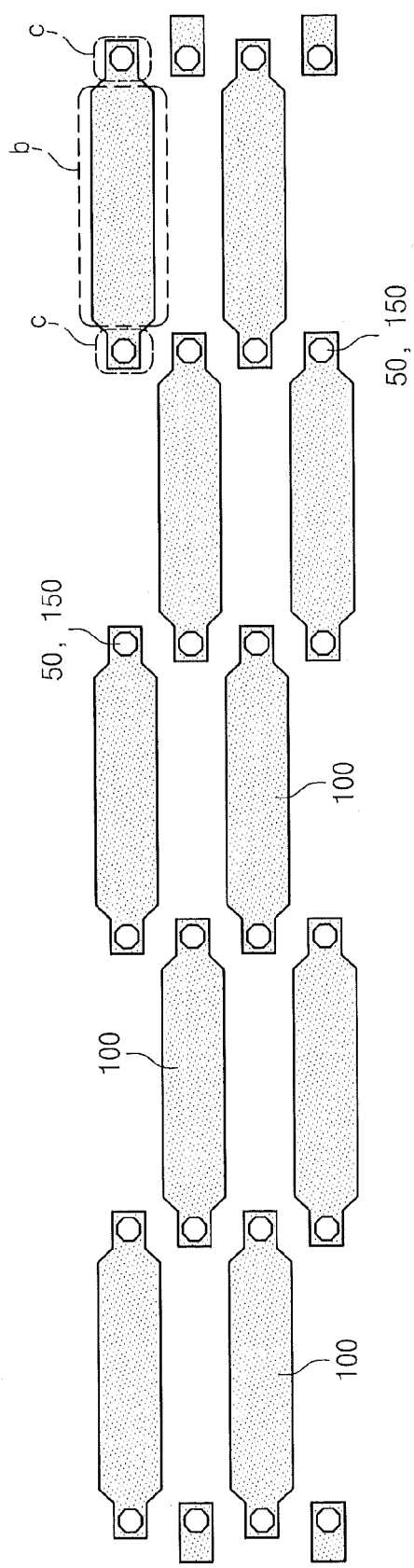
FIGS. 4A and 4B are plan views of the lower and upper interconnection patterns of the semiconductor device of FIG. 3.
Figure 4B:
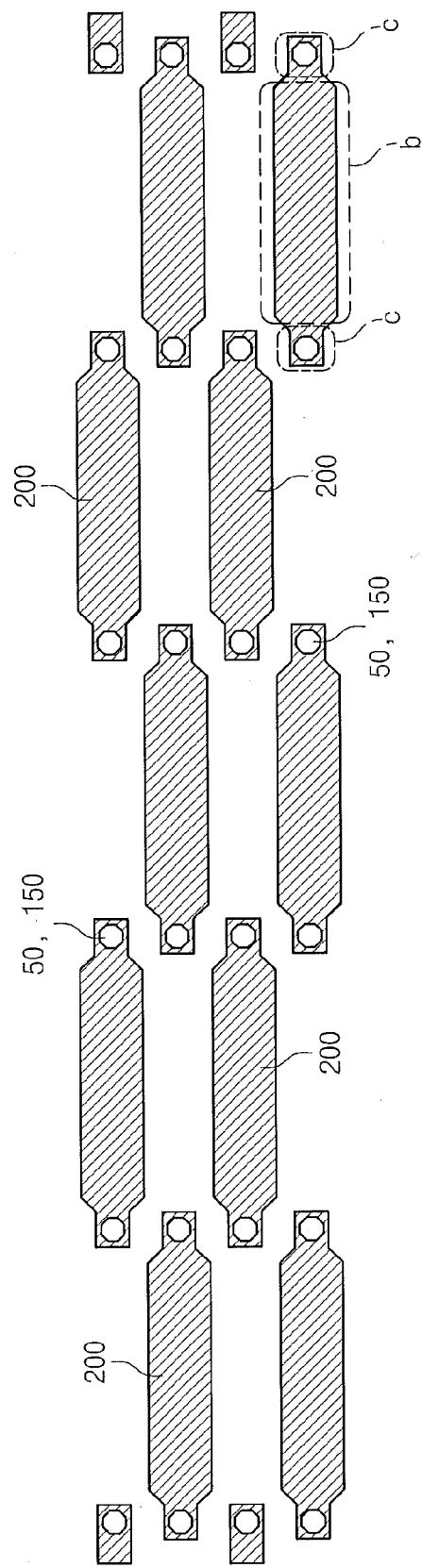

FIG. 3 is a perspective view illustrating the interconnection structures of a semiconductor device according to another embodiment of the inventive concept, and FIGS. 4A and 4B are plan views of the lower and upper interconnection patterns of the embodiment of FIG. 3. For the purpose of brevity, hereinafter, aspects of the embodiment of FIGS. 3, 4A and 4B that were already described above with reference to the embodiment of FIGS. 1, 2A and 2B will not be re-described below.

With reference to FIGS. 3, 4A, and 4B, as described above, since the lower and upper interconnection patterns 100 and 200 are arranged in a checker board shape, the lower and upper interconnection patterns 100 and 200 may include portions having expanded widths.

In more detail, each of the lower and upper interconnection patterns 100 and 200 may include connection portions "c" that may directly connect to a pair of upper plugs 150 and a body portion "b" that is disposed therebetween. The body portion "b" may have an expanded width that is wider than the widths of the connection portions "c". Increasing the width of the body portion "b" of the lower and upper interconnection patterns 100 and 200 may have a technical advantage in that the effective cross-sectional area of the interconnections increases and the resistance of the interconnections decreases.

In still further embodiments of the inventive concept, the lower interconnection pattern 100 may have a shape that is different than the shape of the upper interconnection pattern 200. For example, as will be described with reference to FIGS. 5, 6A and 6B, the horizontal shape of the lower interconnection pattern 100 (i.e., the shape in the plane defined by the top surface of the substrate) may be different from that of the upper interconnection pattern 200, and as will be described with reference to FIG. 10, the sectional shape of the lower interconnection pattern 100 (i.e., the shape in a plane that is normal to the top surface of the substrate) may be different from that of the upper interconnection pattern 200.

Figure 6A:
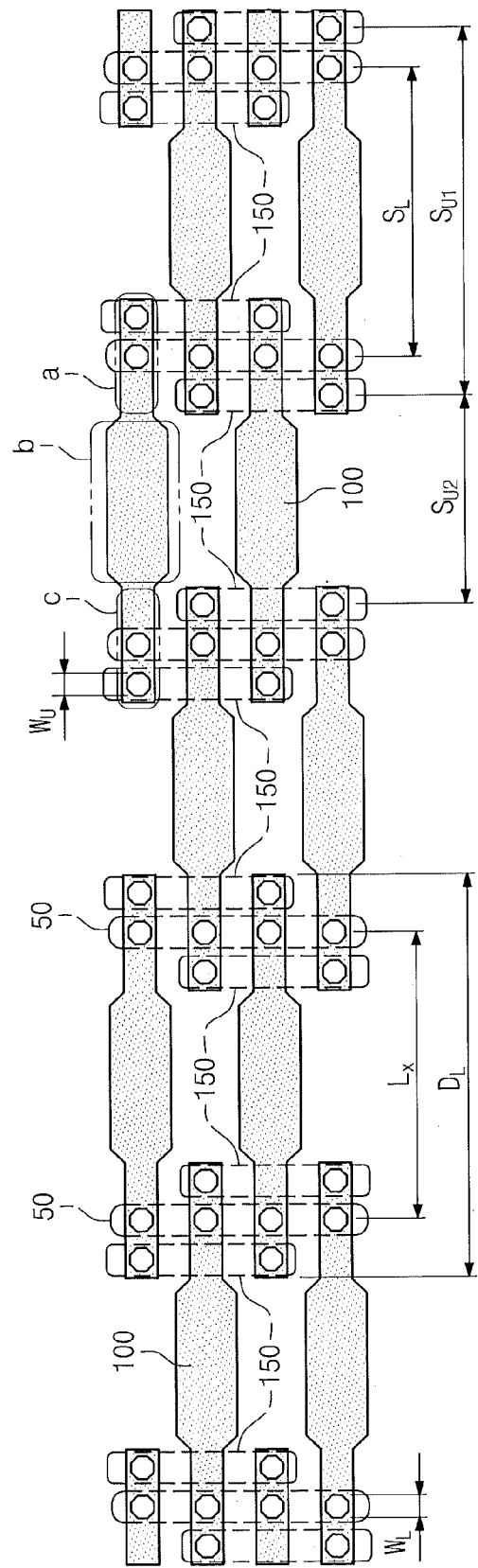
FIGS. 6A and 6B are plan views of the lower and upper interconnection patterns of the semiconductor device of FIG. 5.
Figure 6B:
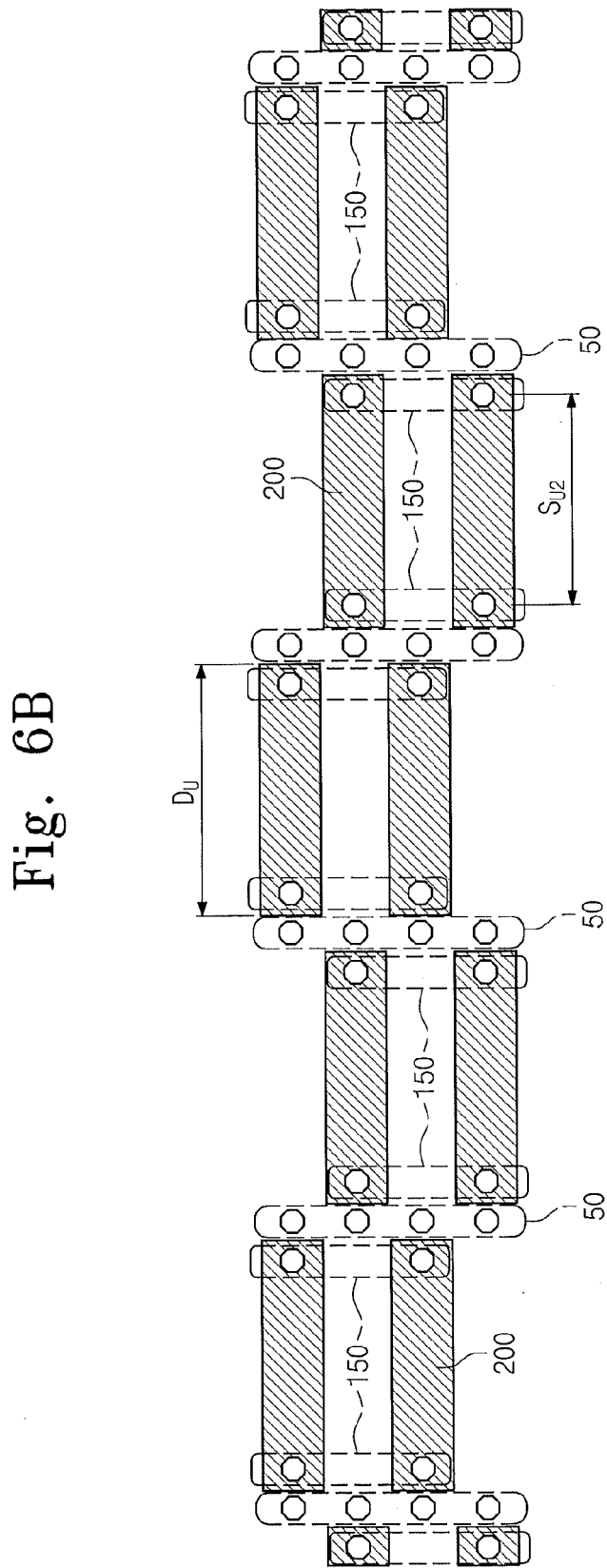

FIG. 5 is a perspective view illustrating interconnection structures of a semiconductor device according to still another embodiment of the inventive concept. FIGS. 6A and 6B are plan views of the lower and upper interconnection patterns of the semiconductor device of FIG. 5. For the purpose of brevity, hereinafter, aspects of the embodiment of FIGS. 5, 6A and 6B that were already described above with reference to the embodiments above will not be re-described below.

With reference to FIGS. 5, 6A, and 6B, according to this embodiment of the inventive concept, the upper plugs 150 may be formed at different positions from the lower plugs 50 in the planar arrangement. For example, the distance $S_{U1}$ between the pair of upper plugs 150 connected to a representative one of lower interconnection patterns 100 may be longer than the distance $S_L$ between the pair of lower plugs 50 that are connected to the same lower interconnection pattern 100.

According to this embodiment of the inventive concept, since the upper plugs 150 are formed so as to be spaced apart from the lower plugs 50 in the planar arrangement, it may be easier to overcome various technical problems that may occur in the manufacturing process. For example, an erroneous alignment margin in photolithography decreases as the integration increases, but a decrease in erroneous alignment margin may cause a technical problem such as an icicle failure. In more detail, when an upper plug 150 is erroneously aligned with respect to the lower interconnection pattern 100, a part of the upper plug 150 may extend below the lower surface of the lower interconnection pattern 100 and may be formed in an icicle shape. The extension portion (that is, the icicle) may cause a variation in the characteristics of the current flowing through the lower plug 50, the lower interconnection pattern 100, and the upper plug 150. According to this embodiment of the inventive concept, however, since the upper plugs 150 are formed so as to be spaced apart from the lower plugs 50 in the planar arrangement, the icicle failure may be suppressed.

The length $D_L$ of the lower interconnection pattern 100 according to this embodiment of the inventive concept is longer than the sum of the unit length $L_x$ in the x direction, the width $W_L$ of the lower plug and twice the width $W_U$ of the upper plug. The length $D_L$ of the lower interconnection pattern 100 may be shorter than twice the unit length $L_x$ in the x direction. In other words, $L_x+W_L+2\,W_U<D_L<2L_x$.

The length $D_U$ of the upper interconnection pattern 200 may be longer than the sum of the distance $S_{U2}$ between the upper plugs 150 connected thereto and the width $W_U$ of the upper plug. However, the length $D_U$ of the upper interconnection pattern 200 may be shorter than the unit length $L_x$ in the x direction so as to minimize an increase in electrostatic capacitance between the adjacent upper interconnection patterns 200.

Figure 7:
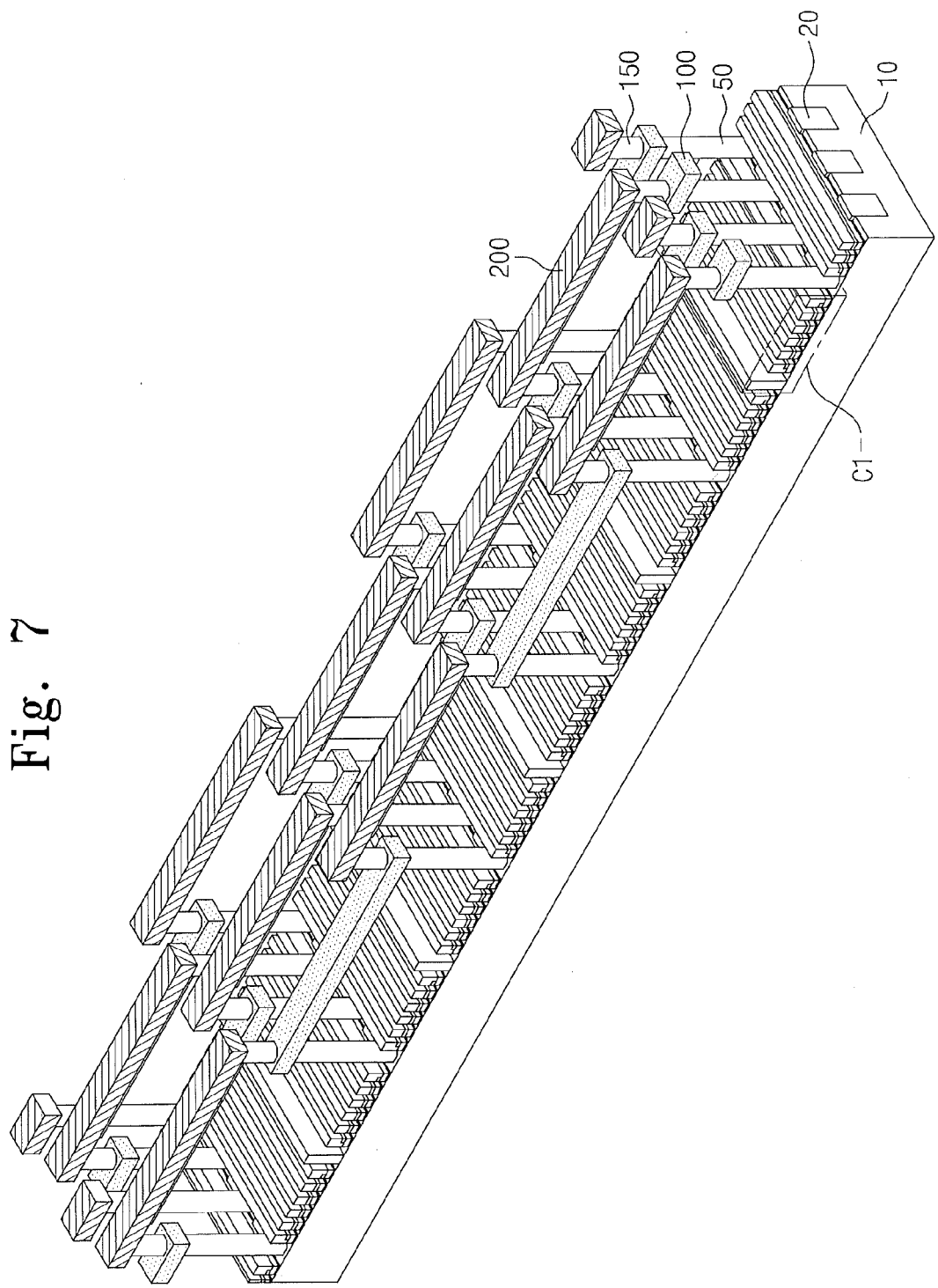
FIGS. 7 through 9 are perspective views illustrating exemplary NAND flash memory devices adopting the interconnection structures of FIGS. 1, 3 and 5, respectively.
Figure 8:
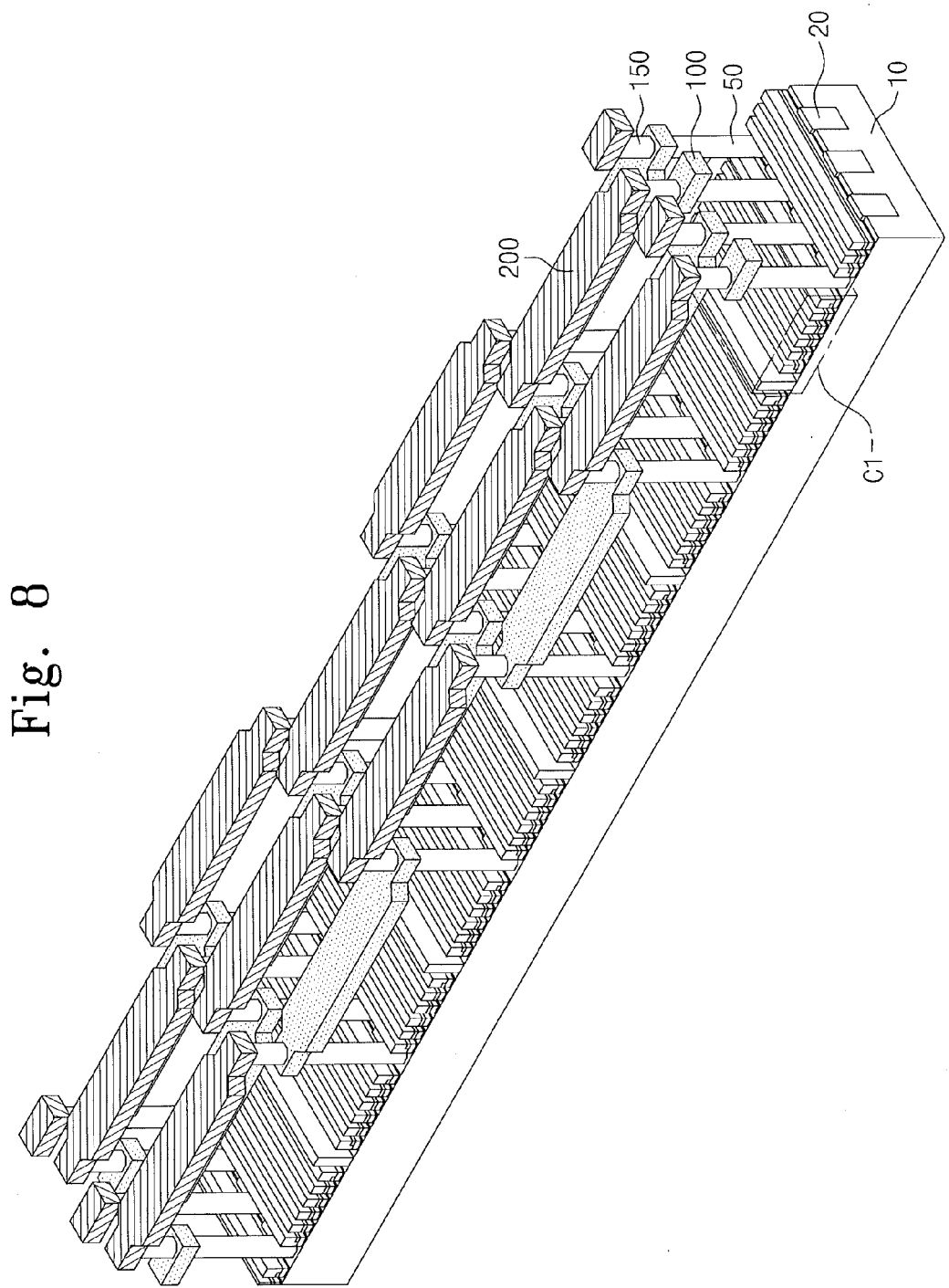
Figure 9:
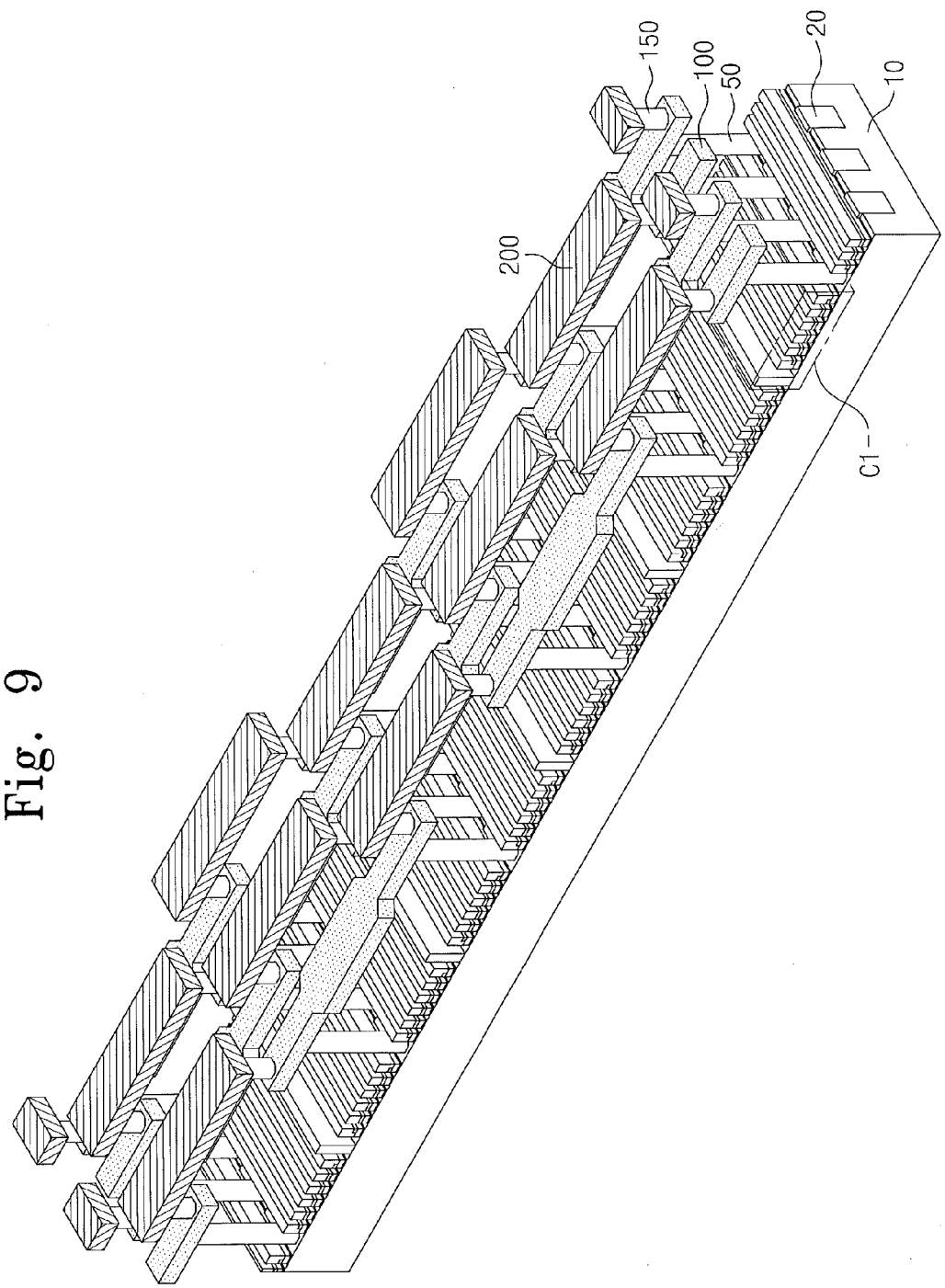

The above-described interconnection structures may be used in various semiconductor devices, including both volatile and nonvolatile semiconductor memory devices. For example, as illustrated in FIGS. 7 through 9, the interconnection structures of the embodiments of the inventive concept described with reference to FIGS. 1, 3, and 5, respectively, may be used to implement NAND flash memory devices. In more detail, with reference to FIGS. 7 through 9, the NAND flash memory devices each include a substrate 10 having element isolation films 20 formed thereon, string structure C1 formed on the substrate 10, and the interconnection structure of one of the embodiments described above with respect to FIG. 1, 3 or 5 disposed on the string structure C1.

Figure 10:
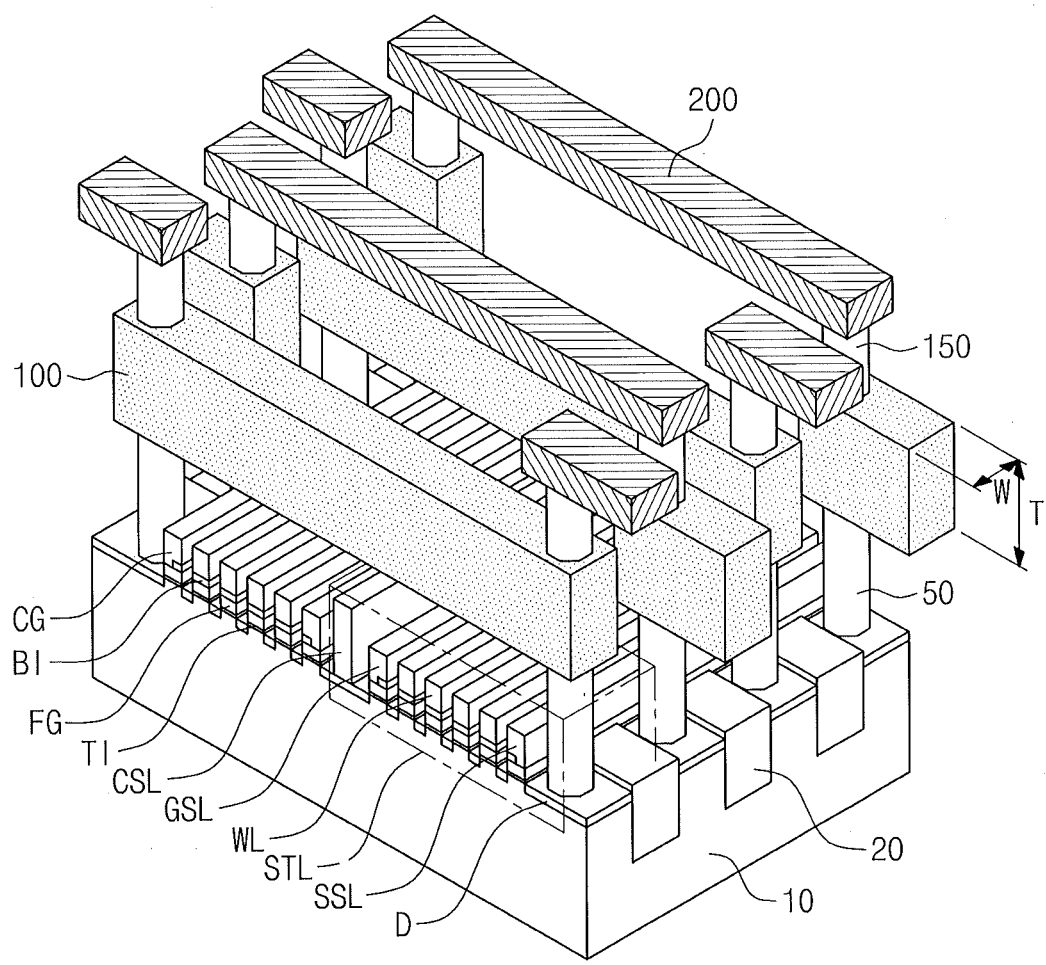
FIG. 10 is a perspective view of a NAND flash memory device according to still further embodiments of the inventive concept.

As illustrated in FIG. 10, the string structure C1 may include a common source line CSL and a plurality of cell strings STL (two of which are illustrated in FIG. 10) connected between drain nodes D. Each of the cell strings STL may include a pair of selection transistors and memory cell transistors therebetween, and the selection and memory cell transistors are connected to each other in series. The selection transistors include at least one ground selection transistor disposed adjacent to the common source line CSL and at least one string selection transistor disposed adjacent to the drain node D. The ground selection transistor and the string selection transistor use a ground selection line GSL and a string selection line SSL, respectively, as gate electrodes. The memory cell transistors use word lines WL, which are disposed between the ground selection line GSL and the string selection line SSL and traverse the element isolation films 20, as gate electrodes.

Each of the ground selection transistor, the string selection transistor, and the memory cell transistor may include a tunnel insulating film TI, a charge storage pattern, and a blocking insulating film BI which are sequentially stacked on the substrate 10. The ground selection line GSL, the string selection line SSL, and the word line WL are disposed on the blocking insulating film BI. According to the embodiment of the inventive concept, as illustrated in the drawing, the charge storage pattern may be a floating gate FG formed from an isolated conductive material. In this case, the ground selection line GSL and the string selection line SSL may electrically be connected to the charge storage pattern (that is, the floating gate FG). According to another embodiment of the inventive concept, the charge storage pattern may be an insulative thin film including many trap sites or an insulative thin film including conductive particles.

The drain nodes D are two-dimensionally arranged on the substrate 10, and as illustrated in FIGS. 7 through 9, each of the drain nodes D is connected to each of the lower plugs 50 of the interconnection structures of the embodiments of the inventive concept described with reference to FIGS. 1, 3, and 5. In the case of the NAND flash memory device, the unit length $L_x$ in the x direction is defined by the lengths of two adjacent strings, and the unit length $L_y$ in the y direction may be defined by a pitch of one string.

According to an aspect of the inventive concept, as described above, the upper interconnection pattern 200 may be formed from a material (for example, aluminum or copper) having specific resistance that is lower than a specific resistance of the lower interconnection pattern 100. In such embodiments, if the lower interconnection pattern 100 and the upper interconnection pattern 200 are formed to have the same cross-sectional area, they will have different resistance values, and the currents flowing through them may undergo a bottleneck phenomenon at the lower interconnection pattern 100 due to the higher resistance value of the lower interconnection pattern 100.

However, the above-described technical problem may be suppressed by selectively increasing the cross-sectional area of the lower interconnection pattern 100 as illustrated in FIG. 10. As discussed above, the cross-sectional area of the lower interconnection pattern may be increased by widening the width of the body portion "b" as described above with reference to FIGS. 3, 4A and 4B. However, there are limits as to how much the width W of the lower interconnection pattern 100 may be increased as it is necessary to ensure that gaps exist between adjacent lower interconnection patterns 100. Accordingly, the cross-sectional area of the lower interconnection pattern 100 may alternatively or additionally be increased by increasing the thickness T of the lower interconnection pattern 100. In particular, as illustrated in FIG. 10, the lower interconnection pattern 100 may be formed to have a thickness that differs from a thickness of the upper interconnection pattern 200. According to some embodiments of the inventive concept, the lower interconnection pattern 100 and the upper interconnection pattern 200 may be formed so that a ratio between the cross-sectional areas thereof is substantially equal to a ratio between the specific resistances thereof.

Figure 11:
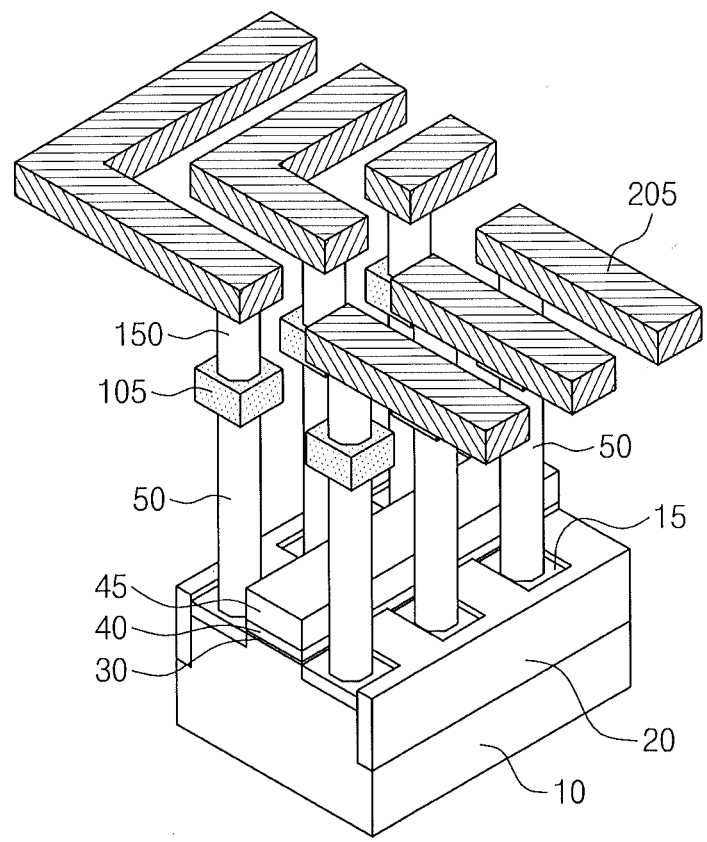
FIGS. 11 and 12 are perspective views illustrating peripheral circuits of semiconductor device according to further embodiments of the inventive concept.
Figure 12:
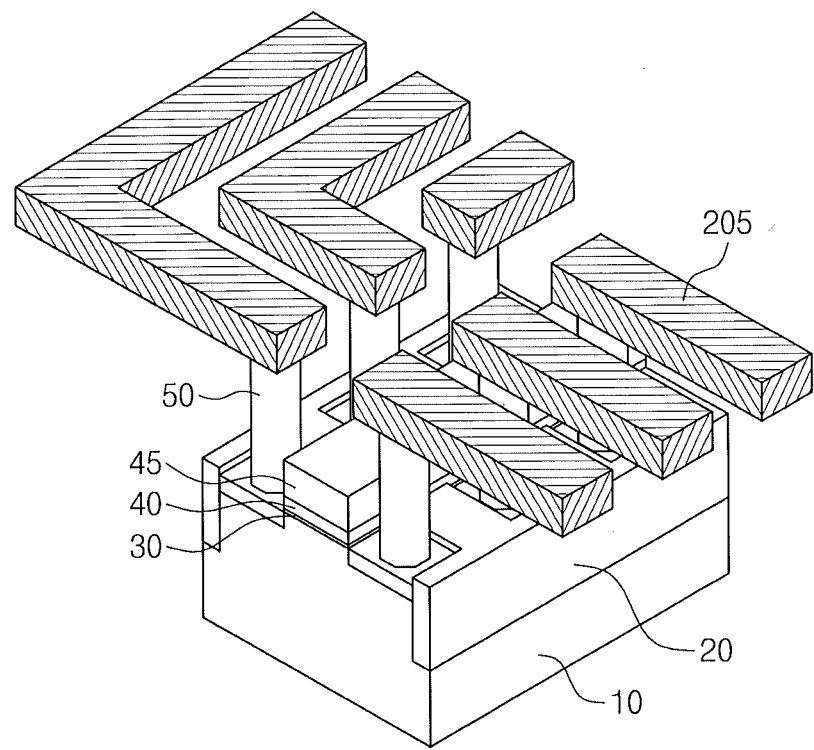

FIGS. 11 and 12 are perspective views illustrating peripheral circuits of a semiconductor device according to further embodiments of the inventive concept. The peripheral circuits of FIGS. 11 and/or 12 may be included in any of the above-described embodiments of the inventive concept.

In the peripheral circuit region of the substrate 10, as illustrated in FIGS. 11 and 12, peripheral transistors that constitute the peripheral circuit may be arranged. The peripheral transistors may include an element isolation film 20 which defines active regions, gate electrodes 40 and 45 which traverse the active regions, a gate insulating film 30 which is disposed between the gate electrodes 40 and 45 and the active regions, and source/drain regions 15 which are formed inside the active region on both sides of the gate electrodes 40 and 45. Peripheral interconnections 205 are arranged on the gate electrodes 40 and 45 so as to be electrically connected to the respective source/drain regions 15. The peripheral interconnections 205 may be formed from a material having a specific resistance that is lower than a specific resistance of the lower interconnection pattern 100 constituting the interconnection structure of the embodiments described with reference to FIGS. 1 through 10.

In some embodiments, the peripheral interconnection 205 may be formed by the same process as the upper interconnection pattern 200. The peripheral interconnection 205 and the upper interconnection pattern 200 may substantially be formed from the same material to have substantially the same thickness. In addition, according to this embodiment of the inventive concept, the upper interconnection pattern 200 constituting the interconnection structure may be formed without additional processes, and hence the semiconductor device may substantially be fabricated without increasing the cost.

With reference to FIG. 11, the peripheral interconnection 205 may be connected to the source/drain regions 15 through the lower plug 50, the peripheral pad 105, and the upper plug 150, which are sequentially stacked. According to this embodiment of the inventive concept, the peripheral pad 105 may be formed by the same process as the lower interconnection pattern 100. According to a modified example of the inventive concept, as illustrated in FIG. 12, the peripheral interconnection 205 may be connected to the source/drain regions 15 through only the lower plug 50 or, in yet another embodiment (which is not illustrated), through the lower plug 50 and the peripheral pad 105.

Figure 13:
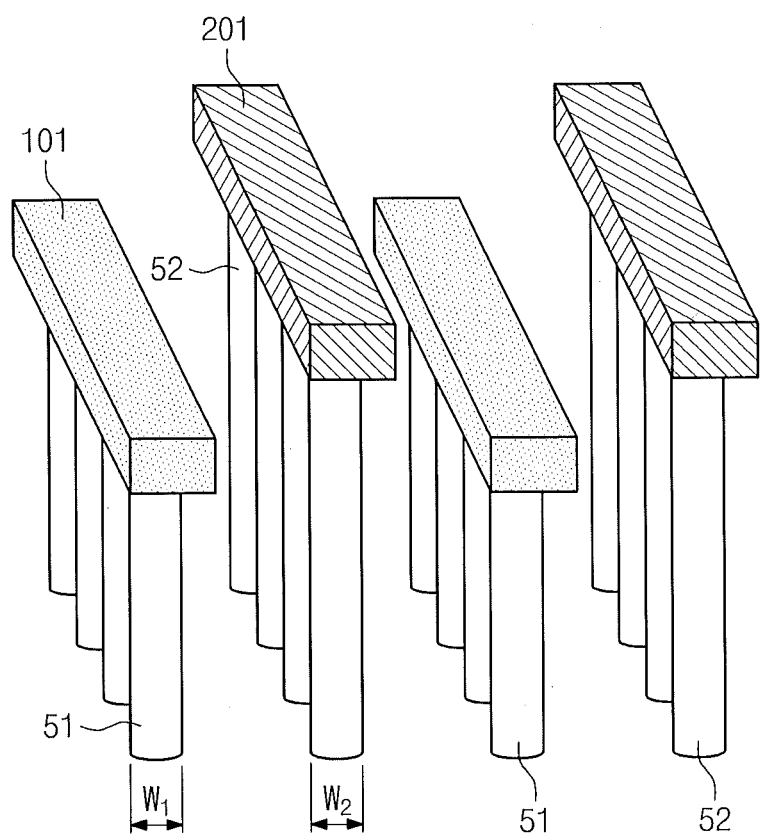
FIGS. 13 and 14 are perspective views illustrating interconnection structures according to embodiments of the inventive concept that may be used to suppress coupling between interconnections.
Figure 14:
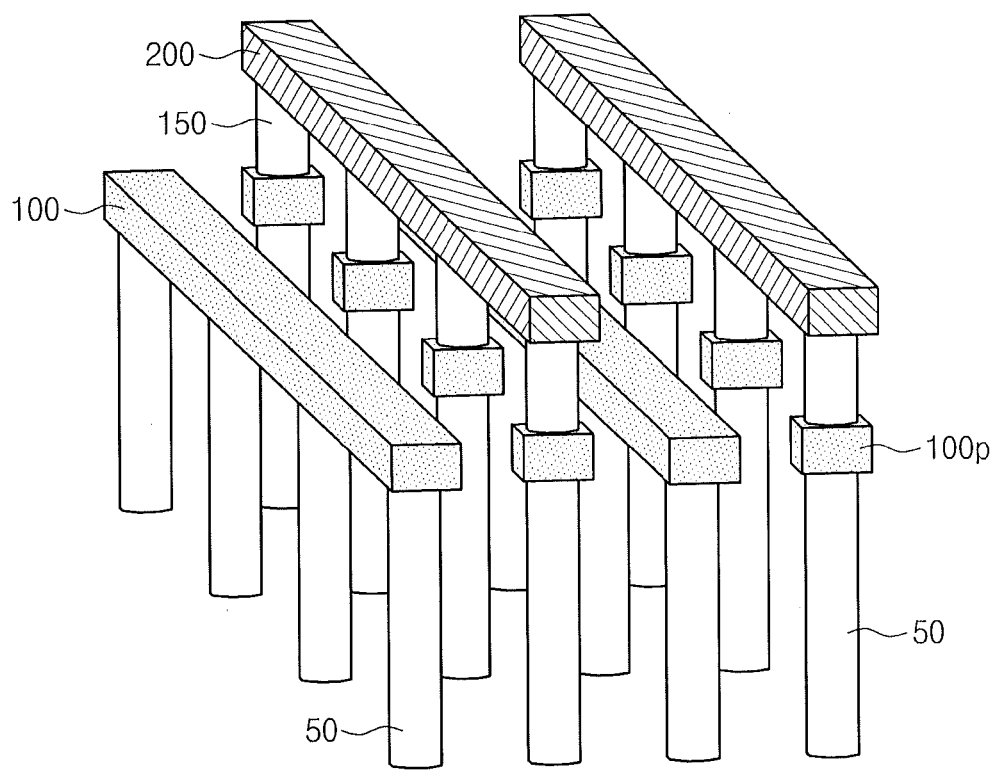

FIGS. 13 and 14 are perspective views illustrating interconnection structures according to embodiments of the inventive concept that may be used to suppress coupling between interconnections.

With reference to FIG. 13, a plurality of first plugs 51 are arranged along a first direction and are electrically connected to each other through a first interconnection 101, and a plurality of second plugs 52 are likewise arranged along the first direction and are electrically connected to each other through a second interconnection 201. The second plugs 52 are arranged along the first direction between the first interconnections 101. The first and second interconnections 101 and 201 are formed at different heights, and hence the above-described interconnection coupling between the first interconnections 101 and the second interconnections 201 may be suppressed.

However, according to these interconnection structures, since the first and second plugs 51 and 52 need to be formed by different processes, the depth of the contact holes that the respective second plugs 52 are formed in need to be larger than the depth of the contact holes that the respective first plugs 51 are formed in. In the case where a sidewall of the contact hole is formed to be perpendicular to the upper surface of the substrate, the widths $W_1$ and $W_2$ of the first and second plugs 51 and 52 may be formed to be equal even if there is a difference in depth of the contact holes. However, since it is difficult to form contact holes that have perpendicular sidewalls, the widths $W_1$ and $W_2$ of the first and second plugs 51 and 52 may be different, which may cause irregularities in one or more electrical characteristics of the semiconductor device.

In order to overcome this technical problem, all the interconnection patterns 100 and 200 constituting the interconnection structure may be connected to lower plugs 50 that have the same height and that are simultaneously formed by the same process. However, when the interconnections are formed at different heights so as to suppress the above-described interconnection coupling, as illustrated in FIG. 14, the interconnection disposed at the upper portion (that is, the upper interconnection pattern 200) may be connected to the lower plug 50 through a landing pad 100p. In such embodiments, the upper plug 150 may be simultaneously formed with the lower interconnection pattern 100. However, it may be difficult to simultaneously form the landing pad 100p with the lower interconnection pattern 100 in highly integrated semiconductor devices.

Figure 15:
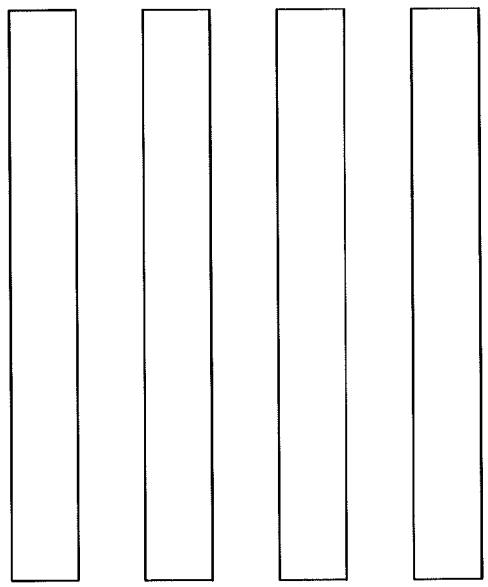
FIGS. 15 through 17 are diagrams illustrating line patterns and isolated patterns.
Figure 16:
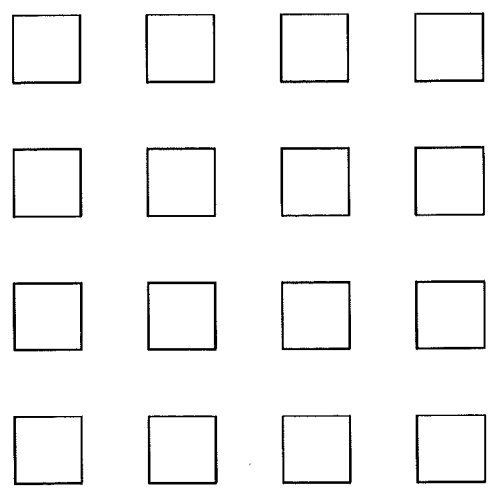
Figure 17:
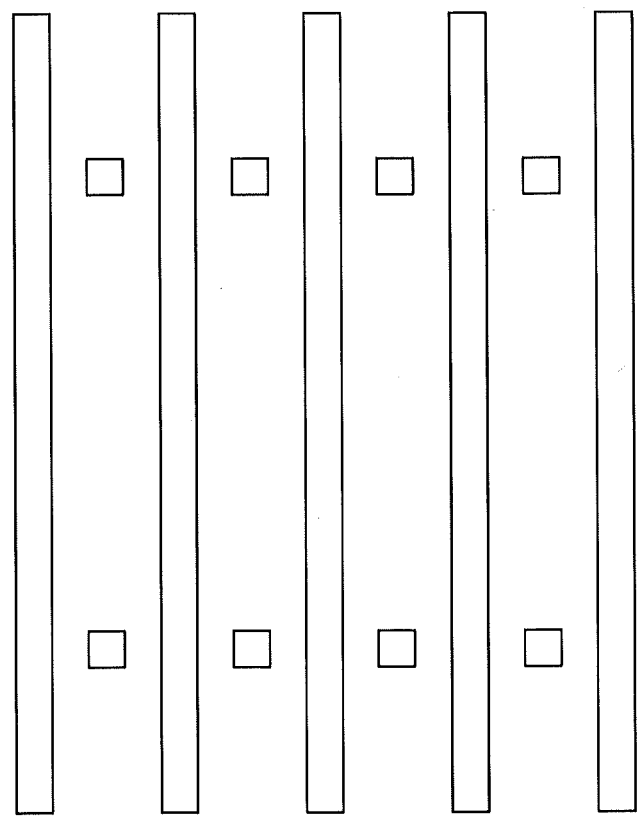

In particular, as the design rule of the semiconductor device is reduced to be 100 nm or less, it may become necessary to form line patterns and insolated patterns (see FIGS. 15 and 16) via different exposure processes using specific optical systems. In contrast, in semiconductor devices adopting a design rule of 100 nm or more, adjacent line patterns and isolated patterns (see FIG. 17) may be formed by one exposure process. In the semiconductor device adopting the design rule of 100 nm or less (particularly, 50 nm or less), however, the adjacent line patterns and isolated patterns illustrated in FIG. 17 may not be formed via a single exposure process using currently available systems. As a result, it is difficult to use the interconnection structure illustrated in FIG. 14 so as to realize semiconductor devices having design rules of 100 nm or less (particularly, 50 nm or less). In the case of the interconnection structure of the embodiments of the inventive concept described with reference to FIGS. 1 through 10, since the patterns (that is, the patterns having the same height) formed by the same photolithography substantially have the same shape, it is possible to suppress the difficulty of the exposure process in the design rule of 100 nm or less.

Figure 18:
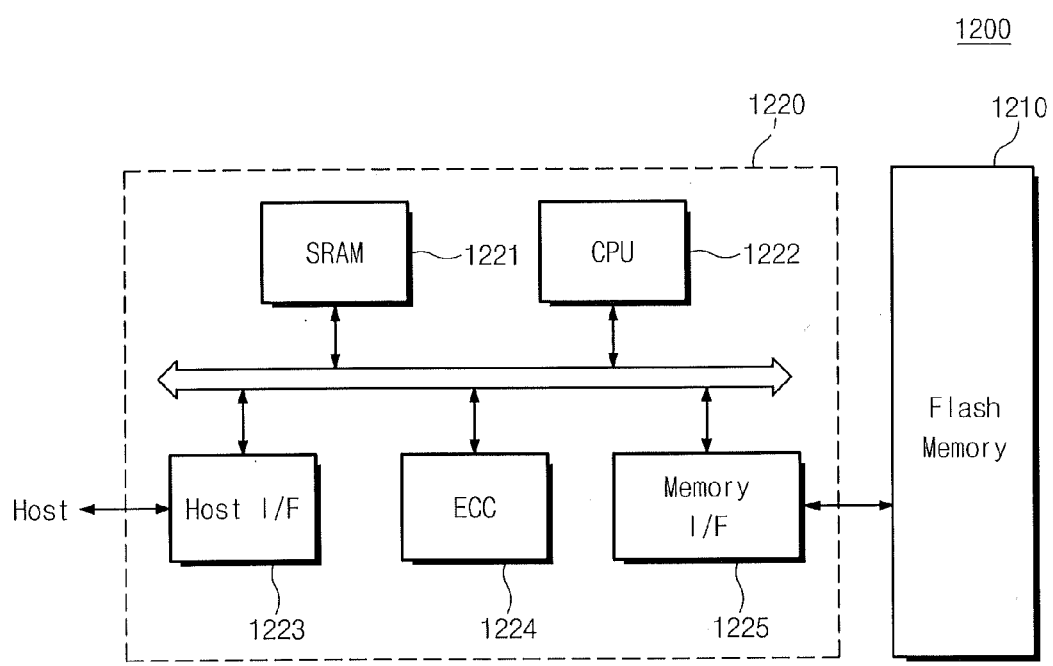
FIG. 18 is a block diagram schematically illustrating an example of a memory card including a flash memory device according to the inventive concept.

FIG. 18 is a block diagram schematically illustrating an example of a memory card including a flash memory device according to still further embodiments of the inventive concept. With reference to FIG. 18, a memory card 1200 for assisting mass data storage ability is equipped with a flash memory device 1210 according to the embodiments of the inventive concept (e.g., any of the flash memory devices described above with respect to FIGS. 7-10). The memory card 1200 includes a memory controller 1220 which controls a general data exchange between a host and the flash memory device 1210.

An SRAM 1221 is used as an operation memory of a central processing unit (CPU) 1222. A host interface 1223 includes a data exchange protocol of the host that is connected to the memory card 1200. An error correcting code block 1224 detects and corrects errors included in data read out from the flash memory device 1210. The memory interface 1225 performs interfacing with the flash memory device 1210. The processing unit 1222 performs general control operations for performing a data exchange of the memory controller 1220. Although not illustrated in the drawing, it is apparent to those skilled in the art that the memory card 1200 further includes a ROM (not illustrated) for storing code data used for interfacing with the host.

According to the flash memory device and the memory card or the memory system of the inventive concept, it is possible to provide the highly reliable memory system through the flash memory device 1210 of which erasing characteristics of dummy cells are improved. Particularly, the flash memory device of the inventive concept may be used in a memory system such as a semiconductor disk device (Solid State Disk: hereinafter SSD) which has been recently developed. In this case, it is possible to realize the highly reliable memory system by interrupting a reading error caused by the dummy cell.

Figure 19:
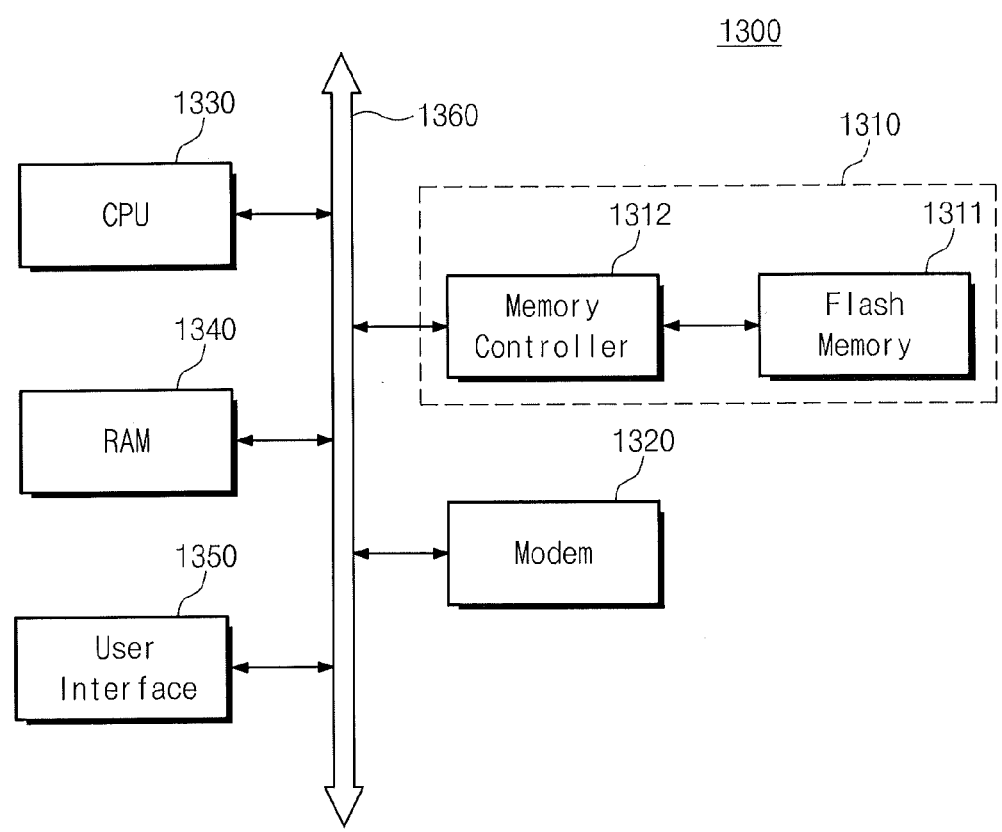
FIG. 19 is a block diagram schematically illustrating an information processing system equipped with a flash memory system according to the inventive concept.

FIG. 19 is a block diagram schematically illustrating an information processing system 1300 equipped with a flash memory system 1310 according to any of the above-described embodiments of the inventive concept. With reference to FIG. 19, the flash memory system 1310 is attached to an information processing system such as a mobile device or a desktop computer. The information processing system 1300 includes the flash memory system 1310 and a modem 1320, a central processing unit 1330, a RAM 1340, and a user interface 1350, which are respectively electrically connected to a system bus 1360. The flash memory system 1310 may substantially have the same configuration as the memory system or the flash memory system. The flash memory system 1310 stores data processed by the central processing unit 1330 or data input from the outside. Here, the above-described flash memory system 1310 may be a semiconductor disk device SSD. In this case, the information processing system 1300 may reliably store a large capacity of data in the flash memory system 1310. In addition, since the flash memory system may reduce a resource consumed for the error correction in accordance with an increase in reliability, the information processing system 1300 may have a high speed data exchange function. Although not illustrated in the drawing, it is apparent to those skilled in the art that the information processing system

1300 may further include an application chipset, a CIS (Camera Image processor), an input/output device, and the like.

In addition, the flash memory device or the memory system according to the inventive concept may be mounted as various types of packages. For example, the flash memory device or the memory system may be packaged and mounted in the forms such as a PoP (Package on Package), a Ball grid arrays (GGAs), a Chip scale packages (CSPs), a Plastic Leaded Chip Carrier (PLCC), a Plastic Dual In-Line Package (PDIP), a Die in Waffle Pack, a Die in Wafer Form, a Chip On Board (COB), a Ceramic Dual In-Line Package (CERDIP), a Plastic Metric Quad Flat Pack (MQFP), a Thin Quad Flatpack (TQFP), a Small Outline (SOIC), a Shrink Small Outline Package (SSOP), a Thin Small Outline (TSOP), a Thin Quad Flatpack (TQFP), a System In Package (SIP), a Multi Chip Package (MCP), a Wafer-level Fabricated Package (WFP), a Wafer-Level Processed Stack Package (WSP), and the like.

According to the embodiments of the inventive concept, it is possible to decrease interconnection coupling by increasing a distance between adjacent interconnections and to suppress the irregularity of the electrical characteristics between the adjacent interconnections without increasing the cost.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A semiconductor device, comprising:
    lower interconnection patterns that are connected to a plurality of drain nodes on a substrate, wherein each of the lower interconnection patterns has a respective center point; and
    upper interconnection patterns that are connected to the lower interconnection patterns, wherein each of the upper interconnection patterns has a respective center point,
    wherein the center points of the upper interconnection patterns are arranged at positions where an absolute value of (n−m) is an even number among coordinate sets given by $(n*L_x, m*L_y)$,
    wherein the center points of the lower interconnection patterns are arranged at positions where the absolute value of (n−m) is an odd number among the coordinate sets given by $(n*L_x, m*L_y)$,
    wherein n and m are natural numbers,
    wherein $L_x$ and $L_y$ are unit lengths in the x and y directions, respectively, and
    wherein * represents a multiplication operation, wherein each lower interconnect pattern is in electrical contact with at least two of the drain nodes.

2. The semiconductor device of claim 1, further comprising:
    lower plugs that are disposed between the lower interconnection patterns and the drain nodes; and
    upper plugs that are disposed between the lower and upper interconnection patterns,
    wherein a respective one of the lower interconnection patterns is connected by a pair of the lower plugs to a pair of adjacent drain nodes having substantially the same y coordinate, and
    wherein a respective one of the upper interconnection patterns is connected by a pair of the upper plugs to a pair of adjacent lower interconnection patterns having substantially the same y coordinate.

3. The semiconductor device of claim 1, wherein ones of the plurality of drain nodes that have the same y coordinate are electrically connected to each other through the ones of the lower and upper interconnection patterns that have substantially the same y coordinate.

4. The semiconductor device of claim 3, wherein the ones of the lower interconnection patterns that are connected to the drain nodes having a first y coordinate are electrically isolated from the ones of the lower interconnection patterns that are connected to drain nodes having y coordinates other than the first y coordinate, and
    the ones of the upper interconnection patterns that are connected to the lower interconnection patterns having the first y coordinate are electrically isolated from the ones of the upper interconnection patterns that are connected to the lower interconnection patterns having y coordinates other than the first y coordinate.

5. The semiconductor device of claim 1, wherein the upper interconnection patterns are formed from a first material having a first specific resistance that is lower than a second specific resistance of a second material that is used to form the lower interconnection patterns.

6. The semiconductor device of claim 1, wherein the substrate includes a cell array region and a peripheral circuit region,
    wherein peripheral elements constituting a peripheral circuit and metallic interconnections electrically connecting the peripheral elements to each other are further formed on the substrate in the peripheral circuit region, and
    wherein the upper interconnection patterns and the metallic interconnections are formed of substantially the same material.

7. The semiconductor device of claim 6, wherein the metallic interconnection and the upper interconnection pattern contain at least one of aluminum and copper, and the lower interconnection pattern contains tungsten.

8. The semiconductor device of claim 1, wherein each of the lower and upper interconnection patterns is a line-shaped conductive pattern connected to a pair of adjacent drain nodes.

9. The semiconductor device of claim 1, further comprising:
    upper plugs that are disposed between the lower and upper interconnection patterns,
    wherein a respective one of the lower and upper interconnection patterns includes connection portions connected to a pair of adjacent upper plugs and a body portion disposed between the connection portions, and
    wherein the body portion has a width that is greater than the widths of the connection portions.

10. The semiconductor device of claim 1, further comprising:
    lower plugs that are disposed between the lower interconnection patterns and the drain nodes; and
    upper plugs that are disposed between the lower and upper interconnection patterns,
    wherein a respective one of the lower interconnection patterns has a length longer than that of each of the upper interconnection patterns, and x coordinates of the upper plugs are different from the x coordinates of the lower plugs.

11. The semiconductor device of claim 1, wherein the semiconductor device further includes a cell array structure that includes a plurality of cell strings, the cell array structure being disposed on a predetermined region of the substrate, each of the cell strings including a pair of selection lines and word lines disposed therebetween, and a pair of cell strings is disposed between two adjacent drain nodes to be commonly connected to a common source line.

12. The semiconductor device of claim 11, wherein each of the drain nodes is included in each of the cell strings, and the lower and upper interconnection patterns traverse a plurality of word lines.

13. A semiconductor device, comprising:

a substrate; and an interconnection structure on the substrate, the interconnection structure including a plurality of interconnection lines that extend substantially parallel to each other in a first direction;

wherein each of the interconnection lines includes a plurality of lower interconnection segments that are at a first height above a surface of the substrate and a plurality of upper interconnection segments that are at a second height above the surface of the substrate that is higher than the first height, wherein in each of the interconnection lines the plurality of lower interconnection segments and the plurality of upper interconnection segments are electrically connected to each other by respective ones of a plurality of upper plugs, wherein the plurality of lower interconnection segments and the plurality of upper interconnection segments of the plurality of interconnection lines, when viewed from above, are disposed in a checkerboard pattern, wherein each of the plurality of lower interconnect segments is in electrical contact with at least two drain nodes.

14. The semiconductor device of claim 13, wherein each of the plurality of lower interconnection segments are electrically connected to the drain nodes on the substrate via a plurality of lower interconnection plugs.

15. The semiconductor device of claim 13, wherein a thickness of each of the plurality of lower interconnection segments in a second direction that is normal to a top surface of the substrate exceeds a thickness of each of the plurality of upper interconnection segments in the second direction.

16. The semiconductor device of claim 13, wherein a width of a middle portion of each of the plurality of lower interconnection segments exceeds a width of the end portions of each of the plurality of lower interconnection segments.

17. The semiconductor device of claim 13, wherein some of the lower interconnection segments have a first length while others of the lower interconnection segments have a second length that differs from the first length.

18. A semiconductor device, comprising:

a substrate; and an interconnection structure on the substrate, the interconnection structure including a plurality of interconnection lines that extend substantially parallel to each other in a first direction;

wherein each of the interconnection lines includes a plurality of lower interconnection segments that are at a first height above a surface of the substrate and a plurality of upper interconnection segments that are at a second height above the surface of the substrate that is higher than the first height, wherein in each of the interconnection lines the plurality of lower interconnection segments and the plurality of upper interconnection segments are electrically connected to each other by respective ones of a plurality of upper plugs, wherein the plurality of lower interconnection segments and the plurality of upper interconnection segments of the plurality of interconnection lines, when viewed from above, define a plurality of rows that extend in the first direction and a plurality of columns that extend in a second direction that is perpendicular to the first direction to form a two-dimensional grid, wherein the lower and upper interconnecting segments are disposed in alternating fashion in each row, and wherein the lower interconnecting segments of every other row are aligned along the second direction and the upper interconnecting segments of every other row are aligned along the second direction, wherein each of the plurality of lower interconnect segments is in electrical contact with at least two drain nodes.

19. The semiconductor device of claim 18, wherein a thickness of each of the plurality of lower interconnection segments in a third direction that is normal to a top surface of the substrate exceeds a thickness of each of the plurality of upper interconnection segments in the third direction.

20. The semiconductor device of claim 18, wherein a width of a middle portion of each of the plurality of lower interconnection segments exceeds a width of the end portions of each of the plurality of lower interconnection segments.

* * * * *